United States Patent
Satomi

(10) Patent No.: US 9,172,340 B2
(45) Date of Patent: Oct. 27, 2015

(54) POWER AMPLIFYING APPARATUS FOR AMPLIFYING POWER AND TRANSMITTER FOR TRANSMITTING SIGNAL BY AMPLIFYING POWER

(71) Applicant: Kabushiki Kaisha Toshiba, Tokyo (JP)

(72) Inventor: Akihiro Satomi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 54 days.

(21) Appl. No.: 13/868,244

(22) Filed: Apr. 23, 2013

(65) Prior Publication Data
US 2014/0055196 A1  Feb. 27, 2014

(30) Foreign Application Priority Data
Aug. 27, 2012 (JP) ................. 2012-186457

(51) Int. Cl.
H03F 3/68 (2006.01)
H03F 3/195 (2006.01)
H03F 3/21 (2006.01)
H03F 3/24 (2006.01)

(52) U.S. Cl.
CPC ............ *H03F 3/68* (2013.01); *H03F 3/195* (2013.01); *H03F 3/211* (2013.01); *H03F 3/245* (2013.01); *H03F 2200/171* (2013.01); *H03F 2200/204* (2013.01); *H03F 2200/207* (2013.01); *H03F 2203/21106* (2013.01); *H03F 2203/21142* (2013.01); *H03F 2203/21157* (2013.01)

(58) Field of Classification Search
CPC .................................. H03F 3/602; H03F 3/68
USPC ............................................. 330/295, 124 R
See application file for complete search history.

(56) References Cited

U.S. PATENT DOCUMENTS

| 4,064,464 | A | * | 12/1977 | Morse ............................ 330/53 |
| 4,772,856 | A | | 9/1988 | Nojima et al. |
| 5,955,926 | A | | 9/1999 | Uda et al. |
| 6,741,144 | B2 | | 5/2004 | Maeda et al. |
| 6,819,171 | B2 | * | 11/2004 | Kenington ...................... 330/51 |
| 7,030,715 | B2 | | 4/2006 | Maeda et al. |
| 8,064,555 | B1 | | 11/2011 | Rockway et al. |
| 2006/0001484 | A1 | | 1/2006 | Paul et al. |

(Continued)

FOREIGN PATENT DOCUMENTS

| JP | 64-53615 A | 3/1989 |
| JP | 1-137710 A | 5/1989 |

(Continued)

OTHER PUBLICATIONS

Office Action issued Jun. 3, 2014 in Japanese Patent Application No. 2012-186457 (with partial English language translation).

(Continued)

*Primary Examiner* — Khanh V Nguyen
*Assistant Examiner* — Khiem Nguyen
(74) *Attorney, Agent, or Firm* — Oblon, McClelland, Maier & Neustadt, L.L.P.

(57) ABSTRACT

A power amplifying apparatus includes a filter that filters a predetermined frequency, a branch line provided subsequently to the filter on a substrate on which the filter is provided to distribute power, a power amplifying device provided subsequently to the branch line to amplify power, and a connecting line provided subsequently to the power amplifying device to compose power. The power amplifying apparatus may further include a directional coupler that monitors transmitted high-frequency signals.

3 Claims, 4 Drawing Sheets

(56) References Cited

U.S. PATENT DOCUMENTS

| | | |
|---|---|---|
| 2007/0111685 A1 | 5/2007 | Paul et al. |
| 2008/0290948 A1 | 11/2008 | Fujii |
| 2011/0068865 A1 | 3/2011 | Mohamadi et al. |
| 2012/0229217 A1* | 9/2012 | Kawano et al. .............. 330/295 |

FOREIGN PATENT DOCUMENTS

| | | |
|---|---|---|
| JP | 7-15255 A | 1/1995 |
| JP | 10-163772 A | 6/1998 |
| JP | 2000-59152 A | 2/2000 |
| JP | 2002-335136 A | 11/2002 |
| JP | 2006-108741 | 4/2006 |
| WO | WO 2006/095051 A1 | 9/2006 |

OTHER PUBLICATIONS

U.S. Appl. No. 14/090,008, filed Nov. 26, 2013, Satomi.

* cited by examiner

POWER AMPLIFYING APPARATUS FOR AMPLIFYING POWER AND TRANSMITTER FOR TRANSMITTING SIGNAL BY AMPLIFYING POWER

CROSS-REFERENCE TO RELATED APPLICATION

This application is based upon and claims the benefit of priority from the prior the Japanese Patent Application No. 2012-186457, filed on Aug. 27, 2012, and the entire contents of which are incorporated herein by reference.

FIELD

Embodiments described herein relate to a power amplifying apparatus and a transmitter.

BACKGROUND

A transmitter requiring high power such as a radar transmitter using, for example, solidified components is used by combining a plurality of power amplifying apparatuses.

A power amplifying apparatus for radar is operated in a non-linear area where efficiency is greater and high power can be obtained. However, if a power amplifying apparatus is operated in a non-linear area, harmonics are contained, in addition to fundamental wave components. Therefore, a filter for filtering to prevent the harmonics from being radiated from an aerial is provided.

In a conventional transmitter, a filter is provided for final output of a composing device composing outputs of power amplifying apparatuses. Therefore, high power resistance is needed, the filter itself is expensive, and it is necessary to use a large filter.

When a small filter is provided in a power amplifying apparatus, the space increases for a space for installing the filter, which makes the size of the power amplifying apparatus larger.

DETAILED DESCRIPTION

Throughout this description, the embodiments and examples shown should be considered as exemplars, rather than limitations on the apparatus and methods of the present invention.

An embodiment of the power amplifying apparatus and transmitter will be described in detail below by using the drawings.

The power amplifying apparatus according to the present embodiment includes a branch line that distributes power, a power amplifying device provided subsequently to the branch line to amplify power, a connecting line provided subsequently to the power amplifying device to compose power, and a filter to filter a predetermined frequency subsequently to the connecting line after being merged into one line.

(Power Amplifying Apparatus)

First Embodiment

Figure 1:
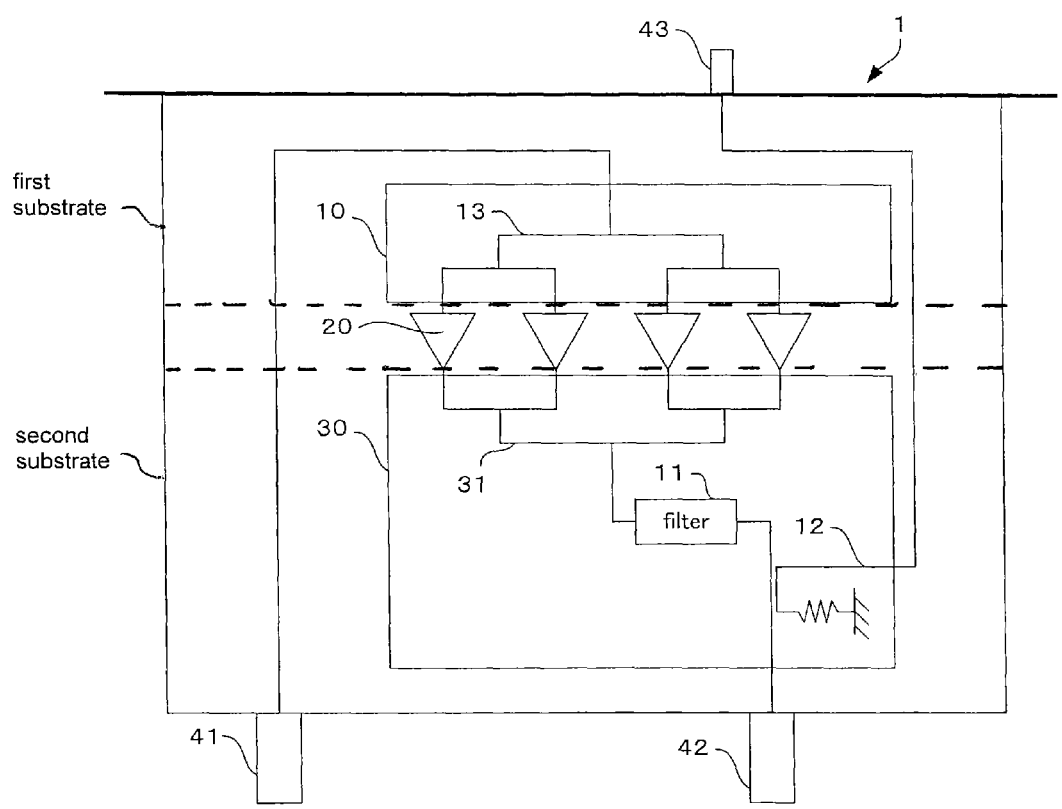
FIG. 1 is a diagram showing a power amplifying apparatus according to a first embodiment.
Figure 2:
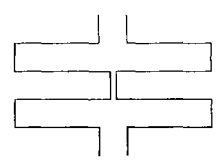
FIG. 2 is a diagram showing an example of a filter.

FIG. 1 is a diagram showing a power amplifying apparatus 1 according to a first embodiment. FIG. 2 is a diagram showing an example of a filter 11.

As shown in FIGS. 1 and 2, the power amplifying apparatus 1 includes a power distribution unit 10, a power amplifying device 20, and a power composing unit 30.

The power amplifying apparatus 1 may further include a directional coupler 12 that monitors transmitted high-frequency signals.

The power distribution unit 10 includes a branch line 13 connected to an input terminal 41 to distribute power. The branch line 13 branches an original line into two.

The power amplifying apparatus 1 includes a plurality of the power amplifying devices 20 that amplify power subsequently to the branch line 13.

The power amplifying apparatus 1 includes a connecting line 31 that composes power subsequently to the power amplifying device 20. The connecting line 31 has a plurality of joints to merge two lines into one.

The power amplifying apparatus 1 includes the filter 11 to filter a predetermined frequency subsequently to the connecting line 31 merged into one line.

For example, a low-pass filter, a band-pass filter or the like are used as the filter 11. The filter 11 is provided subsequently to the power amplifying device 20 in the power composing unit 30 and thus, a small inexpensive filter can be used as the filter 11.

The power amplifying apparatus 1 has the filter 11 and the connecting line 31 on one substrate. That is, the filter 11 and the connecting line 31 can be produced on the substrate at the same time and thus, the manufacturing cost thereof can be kept low.

The output from the filter 11 is connected to an output terminal 42.

The directional coupler 12 is provided along the line between the filter 11 and the output terminal 42 toward the traveling direction of a high-frequency signal transmitted to the line with one end terminated and the other end connected to a monitor output terminal 43.

As shown in FIG. 2, the filter 11 is formed of an air line, a microstrip line and the like, has a length of λ/4 of the higher harmonics to be filtered, and has a plurality of stubs whose one end is open.

The power amplifying apparatus 1 according to the first embodiment includes, as described above, the branch line 13 that distributes power, the power amplifying device 20 provided subsequently to the branch line 13 to amplify power, the connecting line 31 provided subsequently to the power amplifying device 20 to compose power, and the filter 11 to filter a predetermined frequency subsequently to the connecting line 31 after being merged into one line on the substrate on which the connecting line 31 is provided.

Therefore, an effect of being able to manufacture the small power amplifying apparatus 1 at low cost can be achieved.

Second Embodiment

Figure 3:
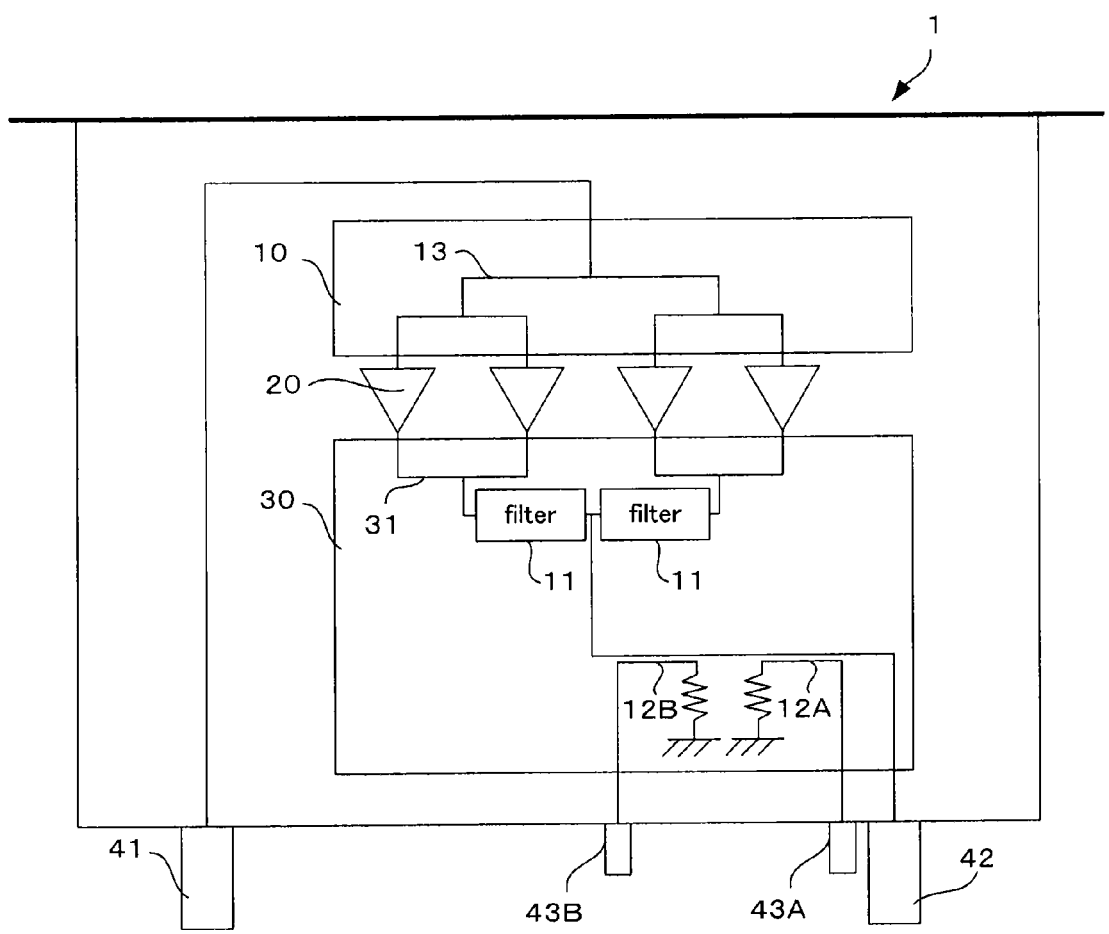
FIG. 3 is a diagram showing the power amplifying apparatus according to a second embodiment.

FIG. 3 is a diagram showing the power amplifying apparatus 1 according to a second embodiment. As shown in FIG.

3, the power amplifying apparatus 1 includes the power distribution unit 10, the power amplifying device 20, and the power composing unit 30.

The power amplifying apparatus 1 may further include a traveling-wave directional coupler 12A that monitors traveling waves of transmitted high-frequency signals and a reflected-wave directional coupler 12B that monitors reflected waves of transmitted high-frequency signals.

The power distribution unit 10 includes the branch line 13 connected to the input terminal 41 to distribute power. The branch line 13 branches an original line into two.

The power amplifying apparatus 1 includes a plurality of the power amplifying devices 20 that amplify power subsequently to the branch line 13.

The power amplifying apparatus 1 includes the connecting line 31 that composes power subsequently to the power amplifying device 20. The connecting line 31 has a plurality of joints to merge two lines into one.

The power amplifying apparatus 1 includes the filter 11 to filter a predetermined frequency prior to a joint that lastly merges the connecting lines 31 into one line.

For example, a low-pass filter, a band-pass filter or the like are used as the filter 11. The filter 11 is provided subsequently to the power amplifying device 20 in the power composing unit 30 and thus, a small inexpensive filter can be used as the filter 11.

The power amplifying apparatus 1 has the filter 11 and the connecting line 31 on one substrate. That is, the filter 11 and the connecting line 31 can be produced on the substrate at the same time and thus, the manufacturing cost thereof can be kept low.

The output from the filter 11 is connected to the output terminal 42.

The traveling-wave directional coupler 12A is provided along the line between the filter 11 and the output terminal 42 toward the traveling direction of a high-frequency signal transmitted to the line with one end terminated and the other end connected to a traveling-wave monitor output terminal 43A.

The reflected-wave directional coupler 12B is provided along the line between the output terminal 42 and the filter 11 toward the reflecting direction of a high-frequency signal transmitted to the line with one end terminated and the other end connected to a reflected-wave monitor output terminal 43B.

The power amplifying apparatus 1 according to the second embodiment includes, as described above, the branch line 13 that distributes power, the power amplifying device 20 provided subsequently to the branch line 13 to amplify power, the connecting line 31 provided subsequently to the power amplifying device 20 to compose power, and the filter 11 to filter a predetermined frequency prior to a joint that lastly merges the connecting lines 31 into one line on the substrate on which the connecting lines 31 are provided.

Therefore, an effect of being able to manufacture the still smaller power amplifying apparatus 1 at low cost can be achieved.

Third Embodiment

Figure 4:
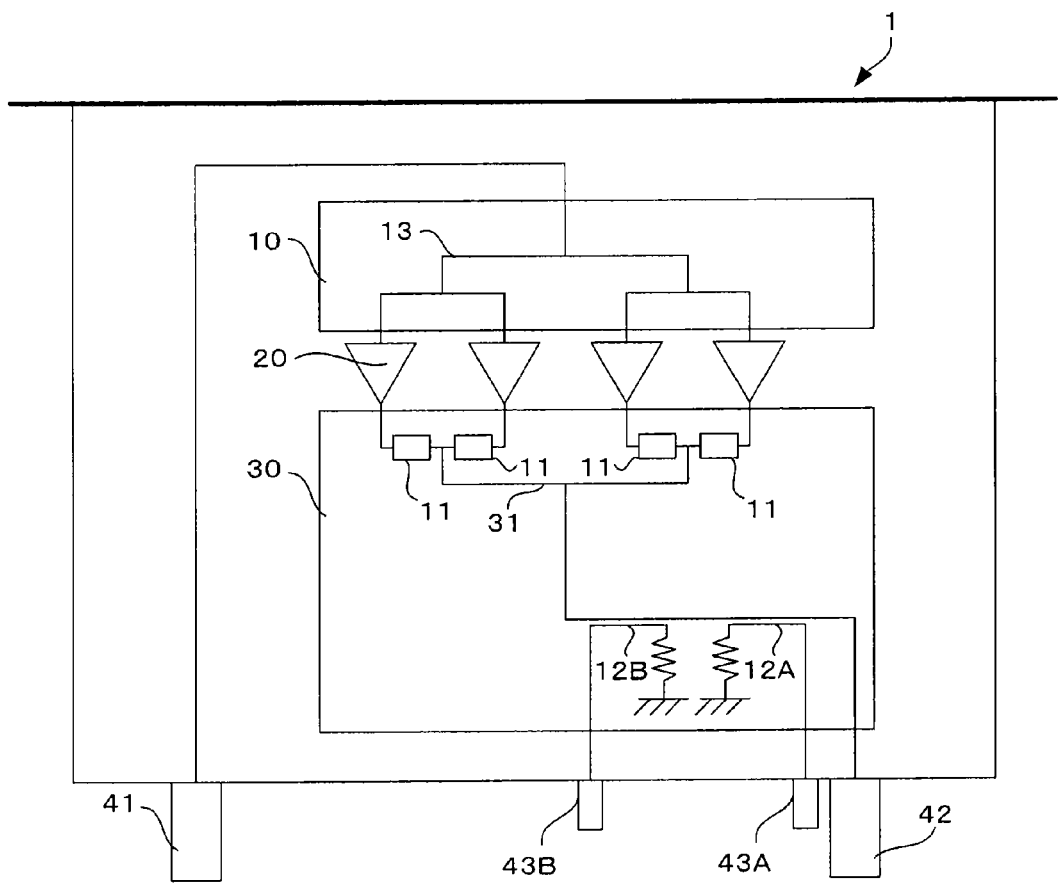
FIG. 4 is a diagram showing the power amplifying apparatus according to a third embodiment.

FIG. 4 is a diagram showing the power amplifying apparatus 1 according to a third embodiment. As shown in FIG. 4, the power amplifying apparatus 1 includes the power distribution unit 10, the power amplifying device 20, and the power composing unit 30.

The power amplifying apparatus 1 may further include the traveling-wave directional coupler 12A that monitors traveling waves of transmitted high-frequency signals and the reflected-wave directional coupler 12B that monitors reflected waves of transmitted high-frequency signals.

The power distribution unit 10 includes the branch line 13 connected to the input terminal 41 to distribute power. The branch line 13 branches an original line into two.

The power amplifying apparatus 1 includes a plurality of the power amplifying devices 20 that amplify power subsequently to the branch line 13.

The power amplifying apparatus 1 includes the connecting line 31 that composes power subsequently to the power amplifying device 20. The connecting line 31 has a plurality of joints to merge two lines into one.

The power amplifying apparatus 1 includes the filter 11 to filter a predetermined frequency prior to the first joint subsequent to the power amplifying device 20.

For example, a low-pass filter, a band-pass filter or the like are used as the filter 11. The filter 11 is provided subsequently to the power amplifying device 20 in the power composing unit 30 and thus, a small inexpensive filter can be used as the filter 11.

The power amplifying apparatus 1 has the filter 11 and the connecting line 31 on one substrate. That is, the filter 11 and the connecting line 31 can be produced on the substrate at the same time and thus, the manufacturing cost thereof can be kept low.

The output from the filter 11 is connected to the output terminal 42.

The traveling-wave directional coupler 12A is provided along the line between the filter 11 and the output terminal 42 toward the traveling direction of a high-frequency signal transmitted to the line with one end terminated and the other end connected to a traveling-wave monitor output terminal 43A.

The reflected-wave directional coupler 12B is provided along the line between the output terminal 42 and the filter 11 toward the reflecting direction of a high-frequency signal transmitted to the line with one end terminated and the other end connected to a reflected-wave monitor output terminal 43B.

The power amplifying apparatus 1 according to the third embodiment includes, as described above, the branch line 13 that distributes power, the power amplifying device 20 provided subsequently to the branch line 13 to amplify power, the connecting line 31 provided subsequently to the power amplifying device 20 to compose power, and the filter 11 to filter a predetermined frequency prior to the first joint on the substrate on which the connecting lines 31 are provided subsequently to the power amplifying device 20.

Therefore, an effect of being able to manufacture the still smaller power amplifying apparatus 1 at low cost can be achieved.

(Transmitter)

Figure 5:
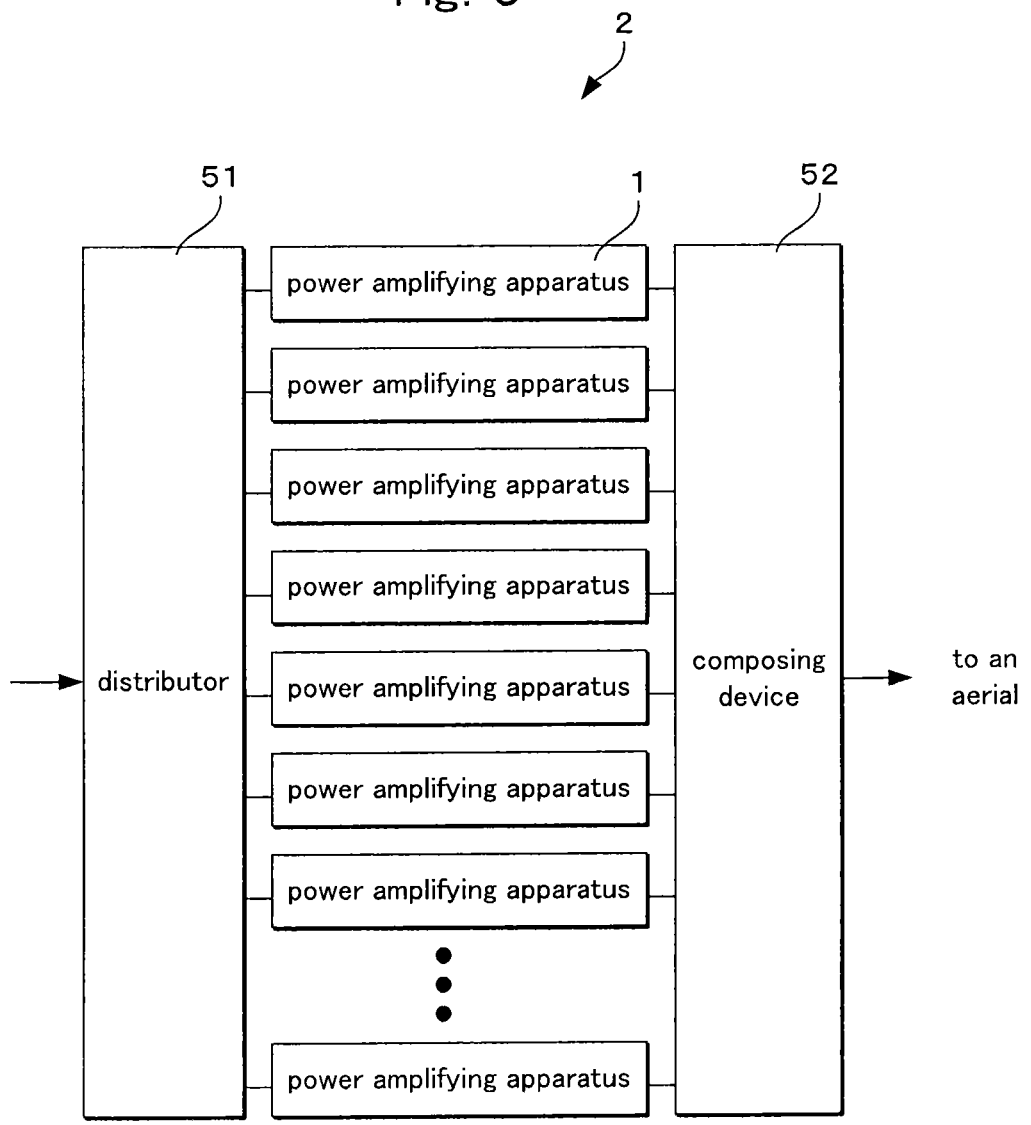
FIG. 5 is a block diagram showing the configuration of a transmitter.

FIG. 5 is a block diagram showing the configuration of a transmitter 2. As shown in FIG. 5, the transmitter includes a distributor 51 that distributes power, a plurality of the power amplifying apparatuses 1 including the branch line 13 that distributes power, the power amplifying device 20 provided subsequently to the branch line 13 to amplify power, the connecting line 31 provided subsequently to the power amplifying device 20 to compose power, and the filter 11 to filter a predetermined frequency subsequently to the connecting line 31 after being merged into one line on the substrate on which the connecting lines 31 are provided and a composing device 52 that composes power amplified by the power amplifying apparatuses 1.

The transmitter 2 can select and use the power amplifying apparatus 1 in the first to third embodiments described above.

Therefore, there is no need to provide an expensive filter between the composing device 52 and an aerial, and an effect of being able to manufacture the small transmitter at low cost can be achieved.

While certain embodiments have been described, these embodiments have been presented by way of example only, and are not intended to limit the scope of the inventions. Indeed, the novel methods and apparatuses described herein may be embodied in a variety of other forms; furthermore, various omissions, substitutions and changes in the form of the methods and systems described herein may be made without departing from the spirit of the inventions. The accompanying claims and their equivalents are indeed to cover such forms or modifications as would fall within the scope and spirit of the inventions.

What is claimed is:

1. A power amplifying apparatus, comprising:
   a branch line that distributes power, the branch line being mounted on a first substrate;
   a power amplifying device provided subsequently to the branch line to amplify the power;
   a connecting line provided subsequently to the power amplifying device to combine the power;
   a filter that filters a predetermined frequency subsequently to the connecting line after being merged into one, the filter being provided prior to a first joint subsequent to the power amplifying device; and
   a directional coupler that monitors transmitted high-frequency signals, the connecting line, the filter, and the directional coupler being provided on a second substrate, and the power amplifying device not being provided on the first substrate and the second substrate, wherein
   the filter, which is provided on the second substrate, is directly connected to an output terminal of the power amplifying device, which is not provided on the first substrate and the second substrate.

2. A power amplifying apparatus, comprising:
   a branch line that distributes power, the branch line being mounted on a first substrate;
   a power amplifying device provided subsequently to the branch line to amplify the power;
   a connecting line provided subsequently to the power amplifying device to combine the power;
   a filter that filters a predetermined frequency subsequently to the connecting line after being merged into one, the filter being provided prior to a joint that lastly merges the connecting lines into one; and
   a directional coupler that monitors transmitted high-frequency signals, the connecting lines, the filter, and the directional coupler being provided on a second substrate, and the power amplifying device not being provided on the first substrate and the second substrate.

3. A transmitter for transmitting a signal by amplifying power comprising:
   a distributor that distributes power;
   a plurality of power amplifying apparatuses that amplifies the power distributed by the distributor, and includes a filter to filter a predetermined frequency, a branch line provided subsequently to the filter on a first substrate to distribute the power, a power amplifying device provided subsequently to the branch line to amplify the power, and a connecting line provided subsequently to the power amplifying device to combine the power;
   a directional coupler that monitors transmitted high-frequency signals, the connecting lines, the filter, and the directional coupler being provided on a second substrate, and the power amplifying device not being provided on the first substrate and the second substrate; and
   a device that combines the power amplified by the power amplifying apparatuses.

* * * * *